(12) United States Patent
Sorg et al.

(10) Patent No.: US 8,937,330 B2
(45) Date of Patent: Jan. 20, 2015

(54) RADIATION-EMITTING COMPONENT

(75) Inventors: Joerg Erich Sorg, Regensburg (DE); Ruediger Mueller, Regenstauf (DE); Raimund Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/823,677

(22) PCT Filed: Aug. 17, 2011

(86) PCT No.: PCT/EP2011/064154
§ 371 (c)(1),
(2), (4) Date: Jun. 7, 2013

(87) PCT Pub. No.: WO2012/034812
PCT Pub. Date: Mar. 22, 2012

(65) Prior Publication Data
US 2013/0248908 A1 Sep. 26, 2013

(30) Foreign Application Priority Data
Sep. 14, 2010 (DE) .......................... 10 2010 045 316

(51) Int. Cl.
*H01L 33/00* (2010.01)
*H01L 33/58* (2010.01)
*H01L 33/56* (2010.01)
*H01L 33/48* (2010.01)

(52) U.S. Cl.
CPC .............. *H01L 33/58* (2013.01); *H01L 33/56* (2013.01); *H01L 33/486* (2013.01); *H01L 2224/32245* (2013.01)
USPC ........... 257/98; 438/26; 438/27; 257/E21.001

(58) Field of Classification Search
USPC ................................................... 257/98–103
See application file for complete search history.

(56) References Cited

U.S. PATENT DOCUMENTS

| 2004/0068077 | A1 | 4/2004 | Salamone et al. |
| 2004/0232825 | A1 | 11/2004 | Sorg |
| 2006/0081864 | A1 | 4/2006 | Nakazawa |
| 2007/0045646 | A1 | 3/2007 | Low et al. |
| 2007/0205425 | A1* | 9/2007 | Harada ........................... 257/98 |
| 2007/0262339 | A1* | 11/2007 | Hussell et al. .................. 257/99 |
| 2007/0267631 | A1 | 11/2007 | Weiner et al. |
| 2007/0267643 | A1 | 11/2007 | Harada et al. |

(Continued)

FOREIGN PATENT DOCUMENTS

| DE | 10 2005 053 218 A1 | 6/2006 |
| DE | 10 2006 037 737 A1 | 6/2007 |

(Continued)

OTHER PUBLICATIONS

Kunz, J., et al., "Determining the Modulus of Elasticity in Compression via the Shore A Hardness," Kunststoffe, No. 6, 2006, 6 pages.

*Primary Examiner* — Cuong Q Nguyen
*Assistant Examiner* — Nishath Yasmeen
(74) *Attorney, Agent, or Firm* — Slater & Matsil, L.L.P.

(57) ABSTRACT

The invention relates to a radiation-emitting component comprising a semiconductor body which emits electromagnetic radiation from a radiation exit surface during operation. The semiconductor body is arranged in a component housing having a cutout. The component further comprises an optical element which is connected to the component housing in a mechanically stable manner by means of a joining layer. The modulus of elasticity of the joining layer is lower than or equal to 30 MPa.

20 Claims, 3 Drawing Sheets

(56) References Cited

U.S. PATENT DOCUMENTS

| | | | |
|---|---|---|---|
| 2008/0023711 A1* | 1/2008 | Tarsa et al. | 257/98 |
| 2008/0044934 A1* | 2/2008 | Loh et al. | 438/21 |
| 2008/0224159 A1 | 9/2008 | Krauter et al. | |
| 2008/0265268 A1 | 10/2008 | Braune et al. | |
| 2008/0277683 A1* | 11/2008 | Tasaki et al. | 257/98 |

FOREIGN PATENT DOCUMENTS

| | | |
|---|---|---|
| DE | 11 2006 000 228 T5 | 3/2008 |
| EP | 1 657 758 A2 | 5/2006 |
| JP | 2002543594 A | 12/2002 |
| JP | 2004146554 A | 5/2004 |
| JP | 2004359756 A | 12/2004 |
| JP | 2005508410 A | 3/2005 |
| JP | 2007142278 A | 6/2007 |
| JP | 2007311445 A | 11/2007 |
| JP | 2008539567 A | 11/2008 |
| JP | 2009506557 A | 2/2009 |
| JP | 2009203475 A | 9/2009 |

\* cited by examiner

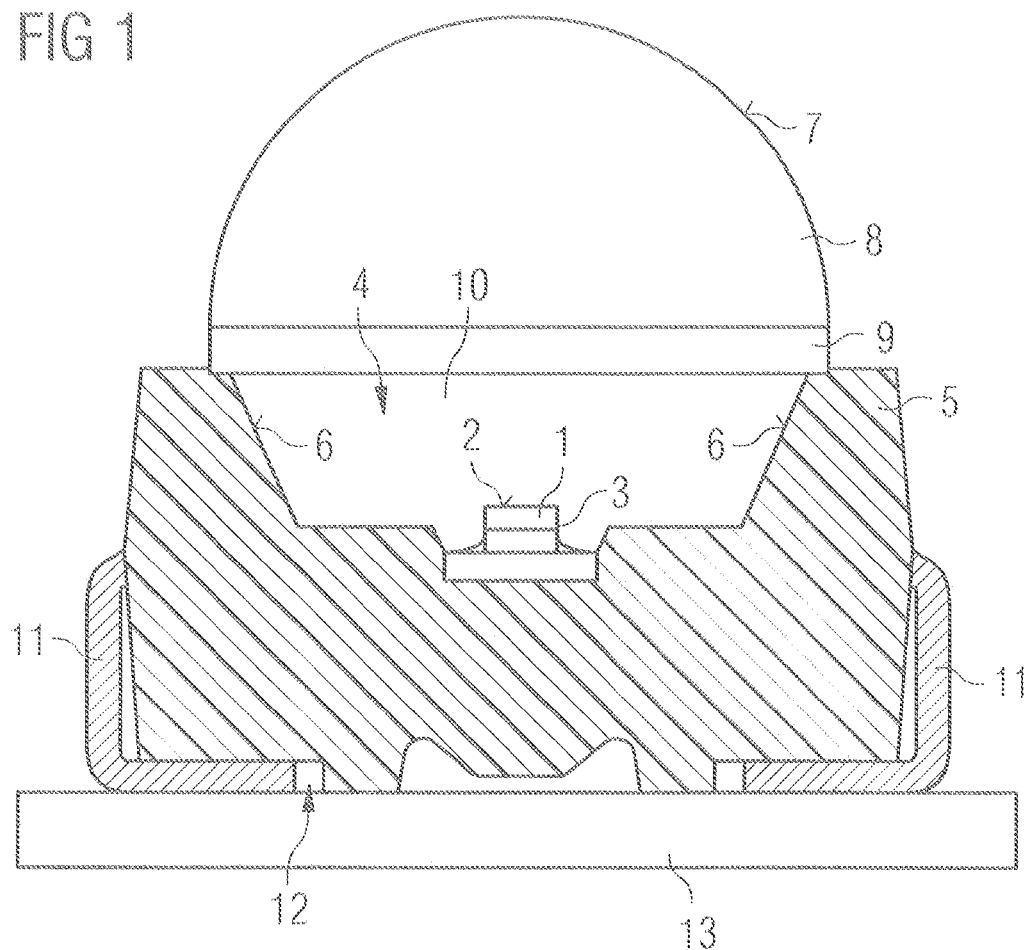

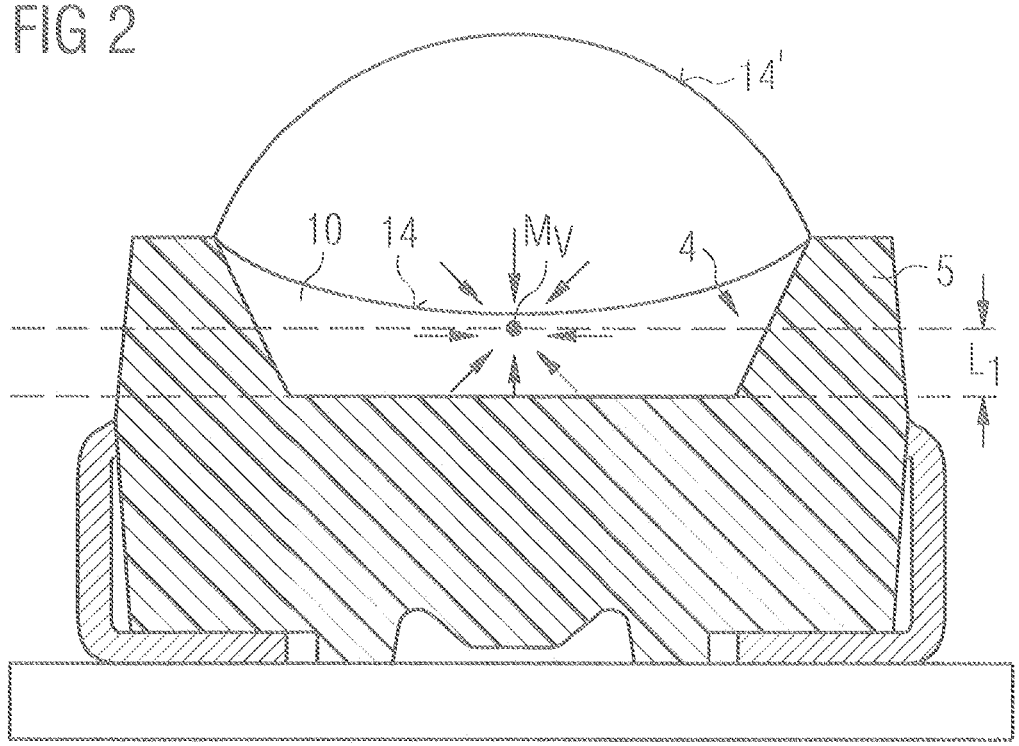

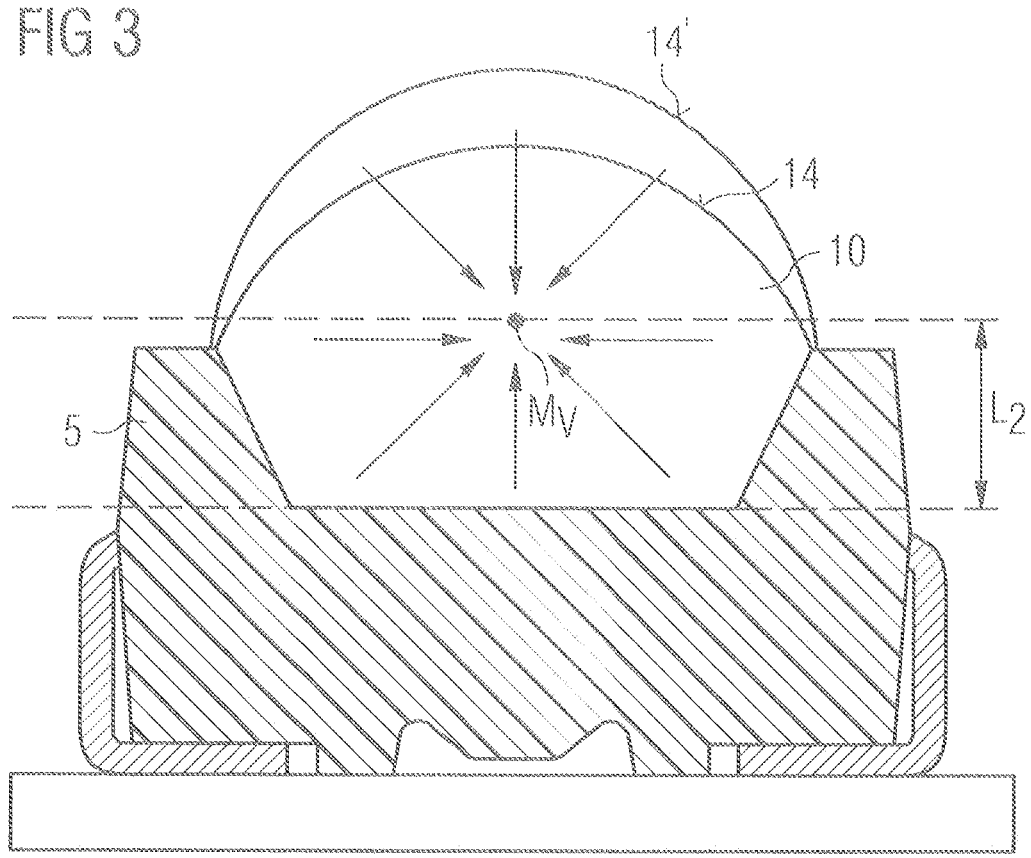

RADIATION-EMITTING COMPONENT

This patent application is a national phase filing under section 371 of PCT/EP2011/064154, filed Aug. 17, 2011, which claims the priority of German patent application 10 2010 045 316.1, filed Sep. 14, 2010, each of which is incorporated herein by reference in its entirety.

TECHNICAL FIELD

A radiation-emitting component is specified.

SUMMARY OF THE INVENTION

Embodiments of the present invention specify a radiation-emitting component which has a good stability with respect to temperature change.

Embodiments of the invention, provide a radiation-emitting component that comprises a semiconductor body that emits electromagnetic radiation from a radiation exit surface during operation. A component housing encompasses the semiconductor body. An optical element is cohesively connected to the component housing by means of a joining layer. The joining layer has a modulus of elasticity of less than or equal to 30 MPa, preferably of less than or equal to 10 MPa.

Particularly preferably, the optical element is a separately produced element. In general, the optical element is arranged in such a way that a large part of the radiation emitted by the semiconductor body passes through the optical element. In general, the joining layer and the optical element form a common interface. Particularly preferably, a main surface of the joining layer is arranged parallel to a radiation exit surface of the semiconductor body. Furthermore, a main surface of the joining layer is particularly preferably arranged parallel to a radiation entrance surface of the optical element. Particularly preferably, a large part of the light emitted by the semiconductor body from the radiation exit surface thereof passes through the joining layer.

Preferably, the joining layer furthermore has a Shore hardness of less than or equal to A90, particularly preferably less than or equal to A45.

The radiation-emitting component is based, inter alia, on the concept of mechanically decoupling the optical element of the component, which is provided for beam shaping in the radiation-emitting component, for example, from the component housing with the aid of an elastic joining layer. Such a component can generally be exposed to comparatively large temperature fluctuations without incurring a relatively large amount of damage. On account of its high stability in respect to temperature change, the component is suitable, in particular, for being subjected to high soldering temperatures, for example, 260° C. for soldering an SnAgCu-based solder, and steep soldering profile ramps. The thermal cycling stability of the component is also effectively increased.

In the case of the present component, externally acting mechanical forces are advantageously absorbed, in particular, in the form of reversible deformations in the joining layer. In this way, stress spikes are effectively cushioned and the component housing is protected. Furthermore, the present component has the advantage that the size and form of the optical element do not influence the component's stability with respect to temperature change. As a result, it is possible to use new designs of optical elements without reducing the component's stability with respect to temperature change.

Conventional components in which the optical element and the component housing are not mechanically decoupled from one another to the greatest possible extent by an elastic joining layer may have the disadvantage of experiencing damage at high soldering temperatures and with steep soldering profile ramps, since the optical element, such as a lens, for example, moves during soldering on account of the thermal expansion of the material and transmits this movement to the housing. A movement of the optical element during the soldering process and the damage to the component possibly resulting therefrom are advantageously at least reduced in the case of the present radiation-emitting component.

In accordance with one embodiment of the component, the joining layer comprises a silicone, an epoxide, a silicone-epoxide hybrid or a polyurethane or consists of one of these materials. Preferably, the thickness of the joining layer is at least 30 µm. Particularly preferably, the thickness of the joining layer is at least 50 µm.

Particularly preferably, the optical element has a modulus of elasticity of greater than or equal to 3500 MPa. An optical element which comprises glass or is formed from glass generally has, for example, a modulus of elasticity of approximately 60 000 MPa. Particularly preferably, the optical element has a Shore hardness of greater than or equal to D80.

If the optical element is mechanically decoupled from the component housing to the greatest possible extent by a joining layer, then it is advantageously possible to use comparatively rigid materials having a high modulus of elasticity and/or a high Shore hardness for the optical element. Optical elements having a high modulus of elasticity and/or a high Shore hardness are advantageously particularly stable mechanically and can therefore contribute to the protection of the comparatively sensitive semiconductor body in the interior of the component.

In accordance with one embodiment, the optical element comprises one of the following materials or consists of one of the following materials: an epoxide, silicone, a silicone-epoxide hybrid, glass, and thermoplastic.

In accordance with a further embodiment of the component, the semiconductor body is arranged in a cutout of the component housing. The cutout of the component housing is preferably filled with a potting. Particularly preferably, the cutout is completely filled with a potting. The potting furthermore preferably forms a common interface with the joining layer. Particularly preferably, there is no air-filled gap present between the potting and the joining layer.

Particularly preferably, a main surface of the potting is arranged parallel to a main surface of the joining layer and parallel to the radiation exit surface of the semiconductor body. Moreover, a large part of the radiation of the semiconductor body passes both through the joining layer and through the potting.

The potting is first provided for protecting the semiconductor body. Furthermore, in general, the coupling-out of light from the component can be increased with the aid of a potting. In this case, the potting is preferably embodied in a radiation-transmissive fashion.

The potting can comprise, for example, an epoxide, a silicone, a silicone-epoxide hybrid material or a polyurethane, or consist of one of these materials. Particularly preferably, the potting has a modulus of elasticity of greater than or equal to 3000 MPa. The Shore hardness of the potting material is furthermore preferably greater than or equal to D89.

The use of a comparatively rigid potting material having a high modulus of elasticity and/or a high Shore hardness makes it possible, in particular, to achieve a particularly good mechanical protection of the semiconductor body. Furthermore, the use of a rigid potting is advantageously possible since the potting is mechanically decoupled from the optical element to the greatest possible extent by means of the soft joining layer.

Preferably, the jump in refractive index between the joining layer and the optical element is less than or equal to 0.3, particularly preferably less than 0.1.

Optical losses when the radiation of the semiconductor body passes through the joining layer and the optical element are advantageously reduced by a small jump in refractive index between the joining layer and the optical element. In accordance with a further embodiment, the jump in refractive index between the potting and the joining layer is also less than or equal to a value of 0.3, particularly preferably less than 0.1.

Optical losses at the interfaces can also advantageously be reduced on account of a particular small jump in refractive index between potting and joining layer.

The use of refractive-index-matched materials in the beam path from the semiconductor body as far as the coupling-out surface of the component makes possible a particularly high optical efficiency of the component. With an expedient optical design, between 90% and 95% of the luminous flux generated by the semiconductor body can be coupled out from the component. Furthermore, the form of the interfaces between the different materials is particularly preferably matched with the aim of beam shaping.

BRIEF DESCRIPTION OF THE DRAWINGS

Further advantageous embodiments and developments of the invention will become apparent from the exemplary embodiments described below in conjunction with the following figures:

FIG. 1 shows a schematic sectional illustration of a radiation-emitting component in accordance with one exemplary embodiment; and FIGS. 2 and 3 show schematic sectional illustrations of radiation-emitting components for elucidating the concept on which this invention is based.

Elements which are identical, of identical type, or act identically are provided with the same reference signs in the figures. The figures and the size relationships of the elements illustrated in the figures among one another should not be regarded as to scale. Moreover, individual elements, such as layer thicknesses, may be illustrated with an exaggerated size in order to enable better illustration and/or in order to afford a better understanding of the embodiments presented in the figures.

DETAILED DESCRIPTION OF ILLUSTRATIVE EMBODIMENTS

The radiation-emitting component in accordance with the exemplary embodiment in FIG. 1 comprises a semiconductor body 1, which is suitable during operation for emitting emits electromagnetic radiation, preferably visible light, from its radiation exit surface 2.

For the purpose of generating radiation, the semiconductor body 1 has an active zone 3, which preferably comprises a pn junction, a double heterostructure, a single quantum well, or particularly preferably a multiple quantum well structure (MQW). In this case, the designation quantum well structure does not include any indication about the dimensionality of the quantization. It therefore encompasses, inter alia, quantum wells, quantum wires and quantum dots and any combination of these structures.

The semiconductor body 1 is mounted into the cutout 4 of a component housing 5. By way of example, the semiconductor body 1 can be adhesively bonded into the component housing 5.

The cutout 4 of the component housing 5 has oblique side surfaces 6 suitable for directing radiation of the semiconductor body 1 to a coupling-out surface 7 of the radiation-emitting component.

Above the cutout 4, an optical element 8, in the present case a lens, provided for beam shaping, is mounted on the component housing 5. The optical element 8 is arranged in such a way that the radiation emitted by the semiconductor body 1 substantially passes through the optical element 8.

A joining layer 9 is arranged between the lens 8 and the component housing 5. The joining layer 9 mechanically stably connects the optical element 8 to the component housing 5. The joining layer 9 has a modulus of elasticity that is less than or equal to 30 MPa, particularly preferably that is less than or equal to 10 MPa. Furthermore, the Shore hardness of the joining layer 9 is preferably less than or equal to A90, particularly preferably less than or equal to A45.

The thickness of the joining layer 9 is preferably greater than or equal to 30 µm and particularly preferably greater than or equal to 50 µm. The joining layer 9 can comprise one of the following materials or consist of one of the following materials, for example, silicone, an epoxide, a silicone-epoxide hybrid, or polyurethane. Particularly preferably, the joining layer 9 comprises a silicone or consists of a silicone.

The optical element 8 of the radiation-emitting component in accordance with the exemplary embodiment in FIG. 1 preferably has a modulus of elasticity of greater than or equal to 3500 MPa, and/or a Shore hardness of greater than or equal to D80. The optical element 8 can comprise one of the following materials or consist of one of the following materials, for example, an epoxide, silicone, a silicone-epoxide hybrid, glass, or thermoplastic.

Particularly preferably, the jump in refractive index between the joining layer 9 and the optical element 8 is less than or equal to 0.1, particularly preferably less than or equal to 0.3.

Furthermore, the cutout 4 of the component housing 5 is completely filled with a radiation-transmissive potting material 10, into which the semiconductor body 1 is embedded. The potting 10 thus forms a common interface with the joining layer 9.

For protecting the semiconductor body 1, the potting 10 is embodied as comparatively rigid. Particularly preferably, the potting 10 has a modulus of elasticity of greater than or equal to 3000 MPa and/or a Shore hardness of greater than or equal to D80.

The potting 10 can comprise one of the following materials or consist of one of the following materials, for example, an epoxide, silicone, a silicone-epoxide hybrid, or polyurethane.

Preferably, the jump in refractive index between the joining layer 9 and the potting 10 is less than or equal to 0.3 or less, particularly preferably less than 0.1.

Furthermore, the component housing 5 has electrical connection strips 11 projecting laterally from the component housing 5. The electrical connection strips 11 are bent to an underside 12 of the radiation-emitting component. The underside 12 is situated opposite the coupling-out surface 7. By means of the electrical connection strips 11, the radiation-emitting component is electrically conductively connected to a carrier 13 via a solder layer (not illustrated). The solder layer is based on SnAgCu, for example. On account of the mechanical decoupling by means of the soft joining layer 9, the component in accordance with FIG. 1 is suitable for withstanding soldering temperatures of approximately 260° C. without incurring damage.

FIG. 2 shows a radiation emitting component comprising a component housing 5 with a cutout 4 in which a potting 10 is arranged. With reference to this Figure, a theoretical estimation will be given below regarding the force exerted on the base of the component housing 5, onto which the semiconductor body 1 is intended to be mounted, in the event of a thermal expansion of the potting 10.

At room temperature, T≈25° C., the potting 10 has an interface 14 with the air. The interface 14 is curved inwardly into the cutout 4. At a temperature T=260° C., the potting material expands such that the interface 14' between potting and air now curves outward. In this stage, the potting 10 has a volume centroid $M_v$. The distance between the volume centroid $M_v$ and the base of the component housing 5 is $L_1$. The force that acts on the base of the component housing 5 on account of the thermal expansion of the potting 10 can be estimated with the aid of the formula for the spring force, $F_{spring}=C \times L$. This results in a force $F_1=C \times L_1$.

In the case of the radiation emitting component in FIG. 3, the potting 10 is now embodied in a lens-shaped fashion in contrast to the component in FIG. 2. At room temperature T≈25° C., the lens-shaped potting 10 has an outwardly curved interface 14 with the air. The volume of the lens-shaped potting 10 increases at a temperature T=260° C. such that the interface 14' between potting and air expands outward. The volume centroid of the potting 10 at a temperature T=260° C. is once again designated by $M_v$. The distance between the volume centroid $M_v$ and the base of the component housing 5 is $L_2$. The force $F_2$ on the base of the component housing 5 on account of the thermal expansion of the potting material is $F_2=C \times L_2$. Since $L_2>L_1$, it also holds true that $F_2>F_1$.

The larger the volume of the potting material in potting 10, the greater the delamination force on the semiconductor body 1 arranged at the base of the cutout 4 when the component is subjected to temperature. If the potting 10 itself is embodied in the form of an optical element, for example, as shown in FIG. 3, then the delamination force is particularly high. By contrast, if, as illustrated in FIG. 1, for example, the optical element 8 is mechanically decoupled from the potting 10 in the cutout 4 of the component housing 5, for example, by means of a soft joining layer 9, then a significantly smaller force acts as the delamination force.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting component comprising:
a semiconductor body configured to emit electromagnetic radiation from a radiation exit surface during operation;
a component housing encompassing the semiconductor body, wherein the semiconductor body is arranged in a cutout of the component housing and the cutout of the component housing is filled with a potting; and
an optical element cohesively connected to the component housing by a joining layer,
wherein the joining layer has a modulus of elasticity of less than or equal to 30 MPa,
wherein the optical element has a modulus of elasticity of greater than or equal to 3500 MPa and/or a Shore hardness of greater than or equal to D80, and
wherein the potting has a modulus of elasticity of greater than or equal to 3000 MPa and/or a Shore hardness of greater than or equal to D80, and
wherein the joining layer has a thickness of at least 30 μm.

2. The radiation-emitting component according to claim 1, wherein the modulus of elasticity of the joining layer is less than or equal to 10 MPa.

3. The radiation-emitting component according to claim 1, wherein the joining layer has a Shore hardness of less than or equal to A90.

4. The radiation-emitting component according to claim 1, wherein the joining layer comprises at least one of silicone, an epoxide, a silicone-epoxide hybrid, or polyurethane.

5. The radiation-emitting component according to claim 1, wherein the joining layer has a thickness of at least 50 μm.

6. The radiation-emitting component according to claim 1, wherein the optical element comprises at least one of an epoxide, silicone, a silicone-epoxide hybrid, glass, or a thermoplastic.

7. The radiation-emitting component according to claim 1, wherein the potting comprises at least one of an epoxide, silicone, a silicone-epoxide hybrid, or polyurethane.

8. The radiation-emitting component according to claim 1, wherein a jump in refractive index between the joining layer and the optical element is less than or equal to 0.3.

9. The radiation-emitting component according to claim 1, wherein a jump in refractive index between the joining layer and the optical element is less than or equal to 0.1.

10. The radiation-emitting component according to claim 1, wherein a jump in refractive index between the potting and the joining layer is less than or equal to 0.3.

11. The radiation-emitting component according to claim 1, wherein a jump in refractive index between the potting and the joining layer is less than or equal to 0.1.

12. The radiation-emitting component according to claim 1, wherein a main surface of the joining layer runs parallel to the radiation exit surface of the semiconductor body.

13. The radiation-emitting component according to claim 1, wherein the optical element has a modulus of elasticity of greater than or equal to 3500 MPa.

14. The radiation-emitting component according to claim 1, wherein the optical element has a Shore hardness of greater than or equal to D80.

15. The radiation-emitting component according to claim 1, wherein the optical element has a modulus of elasticity of greater than or equal to 3500 MPa and a Shore hardness of greater than or equal to D80.

16. The radiation-emitting component according to claim 1, wherein the potting has a modulus of elasticity of greater than or equal to 3000 MPa.

17. The radiation-emitting component according to claim 1, wherein the potting has a Shore hardness of greater than or equal to D80.

18. The radiation-emitting component according to claim 1, wherein the potting has a modulus of elasticity of greater than or equal to 3000 MPa and a Shore hardness of greater than or equal to D80.

19. A radiation-emitting component comprising:
a semiconductor body configured to emit electromagnetic radiation from a radiation exit surface during operation;
a component housing encompassing the semiconductor body; and an optical element cohesively connected to the component housing by a joining layer, wherein the joining layer has a modulus of elasticity of less than or equal to Shore A 45, wherein the optical element has a modulus of elasticity of greater than or equal to 3500 MPa and/or a Shore hardness of greater than or equal to D80, wherein the potting has a modulus of elasticity of greater than or equal to 3000 MPa and/or a Shore hardness of greater than or equal to D80, wherein the joining layer has a thickness of at least 50 μm, and wherein the joining layer is of planar fashion in average.

20. The radiation-emitting component according to claim 1, wherein the joining layer has a constant thickness along a lateral direction.

* * * * *